(12) United States Patent
Ryhänen et al.

(10) Patent No.: US 7,829,799 B2
(45) Date of Patent: Nov. 9, 2010

(54) METHOD FOR MANUFACTURING A MINIATURIZED THREE-DIMENSIONAL ELECTRIC COMPONENT

(75) Inventors: Tapani Ryhänen, Helsinki (FI); Hans Otto Scheck, Espoo (FI); Ove Öhman, Uppsala (SE); Olle Larsson, Stockholm (SE); Michael Read, Uppsala (SE); Tomas Lindström, Uppsala (SE)

(73) Assignee: Nokia Corporation, Espoo (FI)

( * ) Notice: Subject to any disclaimer, the term of this patent is extended or adjusted under 35 U.S.C. 154(b) by 459 days.

(21) Appl. No.: 11/888,571

(22) Filed: Jul. 31, 2007

(65) Prior Publication Data
US 2007/0267217 A1 Nov. 22, 2007

Related U.S. Application Data

(62) Division of application No. 10/475,383, filed on May 18, 2004, now Pat. No. 7,266,882.

(51) Int. Cl.
H01R 13/502 (2006.01)
(52) U.S. Cl. .................................. 174/560; 336/92
(58) Field of Classification Search .......... 174/560, 174/564, 557; 336/92
See application file for complete search history.

(56) References Cited

U.S. PATENT DOCUMENTS

| 4,482,934 | A |   | 11/1984 | Hirota et al. |
| 5,212,345 | A | * | 5/1993 | Gutierrez ............... 174/556 |
| 5,426,404 | A | * | 6/1995 | Kommrusch et al. ...... 333/246 |
| 5,793,272 | A |   | 8/1998 | Burghartz et al. |
| 6,447,449 | B1 |  | 9/2002 | Fleischman et al. |

FOREIGN PATENT DOCUMENTS

| JP | 01301880 | 12/1989 |
| WO | WO 01/25139 | 4/2001 |

OTHER PUBLICATIONS

J. Yoon, C. Han, E. Yoon and C. Kim, "*Monolithic Integration of 3-D Electroplated Microstructures With Unlimited Number of Levels Using Planarization With a Sacrificial Metallic Mold (PSMM),*" IEEE MEMS-1999, pp. 624-629.

T. O'Donnell, P. McCloskey, M. Brunet, R. Winfield, S. O Mathuna, A. Stephen and S. Metev, "*High Aspect Ratio RF Coils Fabricated Using Laser Processing and Micro-Moulding Techniques,*" IMAPS—Europe Prague, Czech Republic, Jun. 18-20, 2000, pp. 169-174.

(Continued)

*Primary Examiner*—Hung V Ngo
(74) *Attorney, Agent, or Firm*—Alfred A. Fressola; Ware, Fressola, Van Der Sluys & Adolphson LLP

(57) ABSTRACT

Manufacturing of miniaturised three-dimensional electric components are presented, as well as components manufactured by the methods. The manufacturing methods comprise micro-replication of at least one master structure, e.g. via a mould structure, in at least one polymer layer onto which layer at least one conductive path is provided.

13 Claims, 9 Drawing Sheets

OTHER PUBLICATIONS

Y. Kim and M. Allen, "*Surface Micromachined Solenoid Inductors for High Frequency Applications*," IEEE Transactions on Components, Packaging and Manufacturing Technology—Part C, vol. 21, No. 1, Jan. 1998, pp. 26-33.

Mirza, N.I., "*Toroidal coil winding machines making the best choice*,"Electrical Electronics Insulation Conference and Electrical Manufacturing & Coil Winding Conference, 1993. Proceedings., Chicago '93 EEIC/ICWA Exposition; Oct. 4-7, 1993; pp. 243-250.

\* cited by examiner

METHOD FOR MANUFACTURING A MINIATURIZED THREE-DIMENSIONAL ELECTRIC COMPONENT

CROSS REFERENCE TO RELATED APPLICATIONS

This application is a divisional of application Ser. No. 10/475,383 filed on May. 18, 2004 now U.S. Pat. No. 7,266,882 and is claiming domestic priority under all applicable sections of 35 U.S.C. §120.

TECHNICAL FIELD

The present invention relates to methods for manufacturing miniaturised electric components, in particular manufacture of miniaturised electric components having a substantially non-flat character with regard to spatial three-dimensional extension.

BACKGROUND

The technique of making small electric components suitable for use in products such as computers and telecommunication equipment has evolved during the last half century into a major branch of industry, producing ever-smaller components. To name an example, the transistor has gone from being a centimetre-sized object in the early days of it's development in the 1940's and 1950's to a sub-micrometer object today.

However, there are still obstacles to be overcome in the field of miniaturisation of electric components. In particular, components that require certain spatial properties, i.e. shape, are still difficult to miniaturise while still retaining optimal electric properties. Such components include inductors, transformers, capacitors etc.

Of course, there have been numerous attempts to produce these types of miniaturised components. For example, three-dimensional micro-machined inductors have been studied by several groups. The geometry of the structures are typically solenoids. Examples of the state of the art include the work presented by J. B. Yoon et al., "Monolithic integration of 3-D electroplated microstructures with unlimited number of levels using planarization with a sacrificial metallic mold", IEEE MEMS-1999 as well as U.S. Pat. No. 5,793,272, which shows an integrated toroidal inductor. U.S. Pat. No. 5,793,272 describes a toroidal coil produced by a dual-damascene process. A 1.4 nH coil produced by this process achieved a Q value of 40 at 5.8 GHz.

However, all these state of the art integrated inductors for radio frequency application are based on a planar geometry. The limitations of planar integrated coils are several and include that the Q value of the inductor is limited by self-resonance due to the parasitic capacitance of the coil through capacitive coupling to the substrate. Also the ratio of the inductance and series resistance is not optimal. Secondly, the magnetic field of the inductor couples to the surrounding electronics. Hence, interference with other parts of the electronics limits the density of inductive components on the chip.

Moreover, planar inductors with high Q values are large in terms of silicon surface area, an area that cannot be utilised for any other purpose.

SUMMARY OF THE INVENTION

It is hence an object of the present invention to solve a problem of how to obtain miniaturised electric components having a substantially non-flat character with regard to spatial three-dimensional extension.

In its most general aspect the present invention solves the problem in that it provides a method for manufacturing a miniaturised three-dimensional electric component. The manufacturing method comprises micro replication of at least one master structure. The replication takes place via a mould structure, e.g. an insert, or a template structure, in at least one polymer layer onto which layer at least one conductive path is provided.

An advantage of the invention in relation to prior art methods for manufacturing miniaturised electric components lies in the fact that the component is realised in a polymer material, as opposed to prior art techniques of utilising, e.g. Silicon wafers Polymer materials can be formed into more or less arbitrary shapes by casting or by injection moulding or embossing.

Particularly advantageous is the use of the method of the present invention when manufacturing electric inductors, and most notably, arrays of inductors, for use in e.g. small hand held radio devices such as mobile communication terminals. In such devices there is a need for analogue filters, resonators and matching circuits in which LC-circuits are necessary. In such circuits there is an inherent need for inductors having high Q-values, as will be discussed in some detail below in connection is with a preferred embodiment of the invention.

Another advantage obtained by the use of polymers to create small-scale components relies on the simple fact that a polymer layer can be used to buffer the thermal expansion mismatch between different layers. The components manufactured by the present inventive method become extremely compact and hence are capable of being located in close proximity to other circuitry that may generate more or less heat and hence create conditions for differential expansion of substrates etc. Polymers are usually poor heat conductors and hence the use of polymers to manufacture the components enables a user to design circuitry where heat-emitting components may be located more or less close to heat sensitive components.

In a first preferred embodiment of the invention, the method is realised in a number of processing steps defining a more or less direct manufacture of a component from a master structure carrying all the required three-dimensional geometry of the component. The method according to the first embodiment comprises the processing steps of copying the master structure to create a mould structure, e.g. an insert. The mould structure is then used in turn to replicate the master structure in a first and second polymer layer. Polymer support structures are hence obtained.

A first conductive path and a second conductive path are then provided onto the respective first and second polymer layers. The two polymer layers are then joined, thereby obtaining the electric component. Alternatively, the conductive path may be provided after joining the polymer layers.

As will be discussed further below, the polymer layers and the conductive paths may be obtained by a number of different methods.

In a second preferred embodiment of the invention, the method is realised in a number of processing steps defining manufacture of a component from a master structure carrying the required three-dimensional geometry of the component in a slightly different manner where the master structure is replicated into a template structure for the component to be. The method according to the second embodiment comprises the processing steps of providing a first conductive path and a second conductive path onto a respective first and second template structure. A first polymer layer and a second polymer layer are provided onto the respective first and second template structures, thereby replicating the respective master structures in the respective polymer layers. This results in a first and second polymer layer, i.e. a structure, joined to the respective first and second conductive path. The first and second template structures are then separated from the respective first and second polymer layers and the two polymer layers are then joined, thereby obtaining the electric component.

It is to be noted that the first and the second template structure may be one and the same template structure which is used as the first template structure in an initial polymer layer creation sequence, and in a second sequence as the second template structure.

In a third preferred embodiment of the invention, the method is realised in a number of processing steps defining manufacture of a component from a master structure. In this embodiment a first polymer layer, i.e. a structure, having a conductive path may be obtained either via a more or less direct manufacturing method as discussed in connection with the first embodiment, or as in the second embodiment where a template acts as a support firstly for the conductive path and subsequently the polymer layer. The method according to the third embodiment then further comprises the processing steps of providing a sacrificial structure onto the conductive path on the polymer layer structure already obtained. A second conductive path is then provided onto the sacrificial structure, whereupon the sacrificial structure can be removed, thereby obtaining the electric component. However, it is not necessary to remove the sacrificial structure.

As in the first preferred embodiment of the invention, in these second and third embodiments the polymer layers and the conductive paths may be obtained by a number of different methods, as will be discussed further below.

PREFERRED EMBODIMENTS

Figure 1:
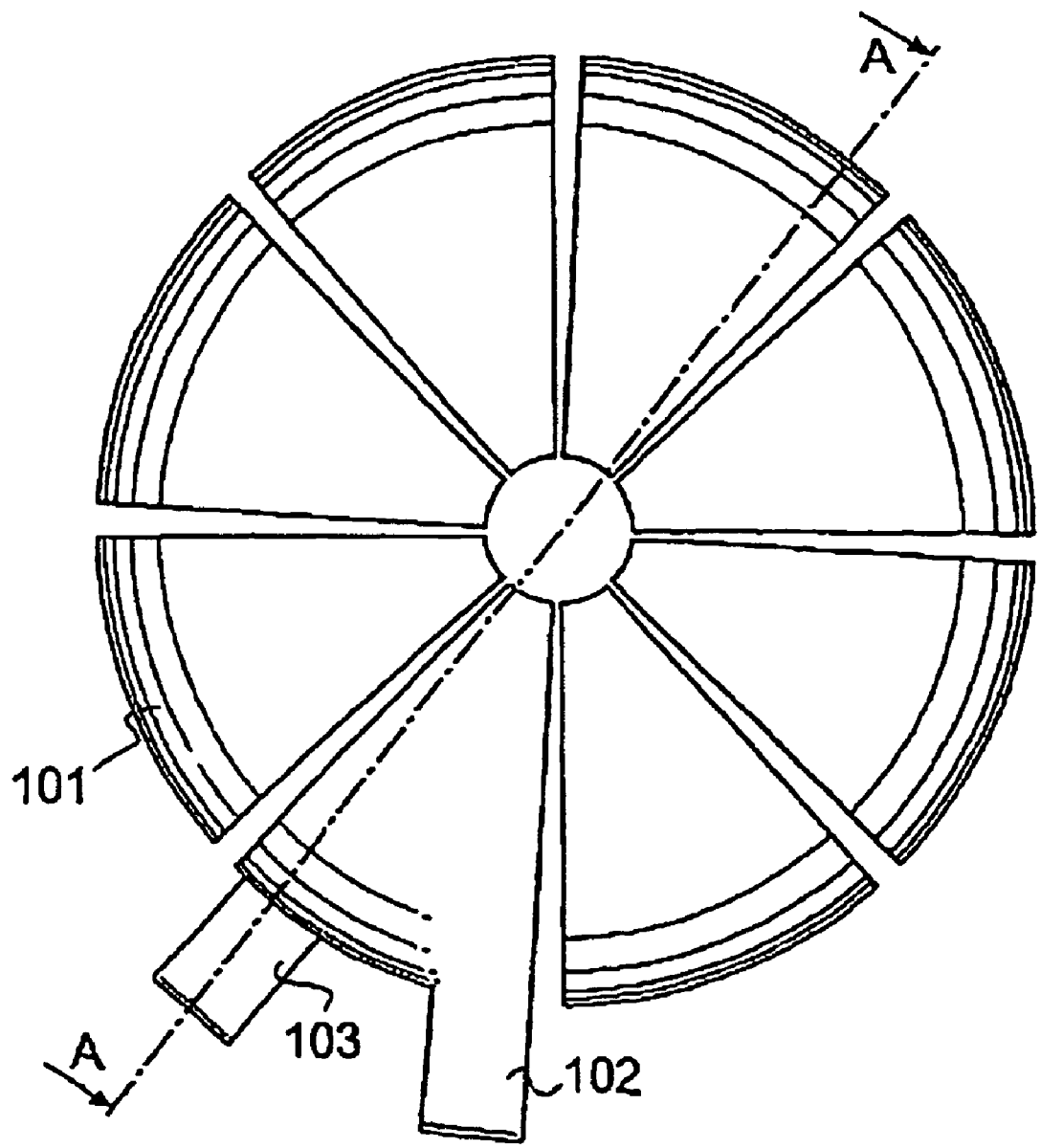
FIG. 1 shows schematically a top view of a toroidal inductor manufactured according to the present invention.

The invention in its general form, as discussed above, is related to manufacture of any electric component. In the description to follow below, a number of embodiments of a manufacturing method will be presented. Common to the embodiments is the choice of a toroidal inductor, i.e. a toroidal coil, as representing the electric component to be manufactured. Small-scale inductors are required in many kinds of products, not least in the field of small hand-held devices such as mobile telephone terminals containing high frequency radio transmitters and receivers as well as transformers and baluns. FIG. 1 shows a top view of a toroidal inductor, as it would appear if exposed. As will be shown, however, the toroidal coils manufactured according to the inventive method will after the last step of manufacture be enclosed by a polymer material and not be visible to inspection such as FIG. 1 suggests. The coil of FIG. 1 comprises a torus shaped conductive path 101 having connecting ends 102,103. A typical size of such a component is on the order of $10^2$ μm.

The embodiments of the manufacturing method will be presented by use of schematic figures of such an enlarged scale that only one component, i.e. toroidal coil, is visible in each figure. However, it shall be stressed that, when utilising the manufacturing method according to the invention, machinery suitable for manufacturing, e.g., optical discs such as CD or DVD is a preferred choice. As the skilled person will appreciate, the use of such machinery entails producing polymer layers suitable for manufacturing a plurality of components simultaneously.

Three preferred embodiments of the invention will be disclosed with reference to cross sectional views in FIGS. 2-6. The cross sectional views may, e.g., be the AA-section indicated in FIG. 1. Each embodiment requires a pre-fabricated original or master, which contains the required three-dimensional geometrical features of the final structure of the components. It is assumed that fabrication of the original or master is known to the skilled person and that the skilled person will select the most appropriate method amongst available methods for silicon micromachining.

Figure 2A:
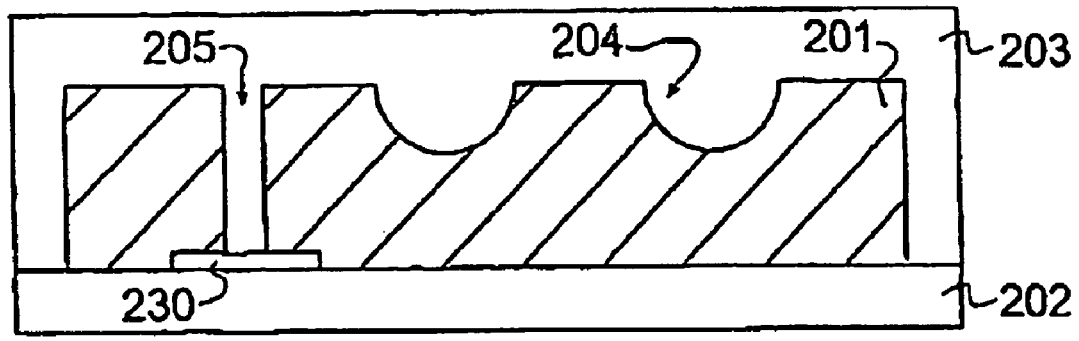
FIG. 2a-2d shows schematically cross sectional views of substrates during different stages of a first embodiment of a manufacturing method according to the present invention.
Figure 2B:
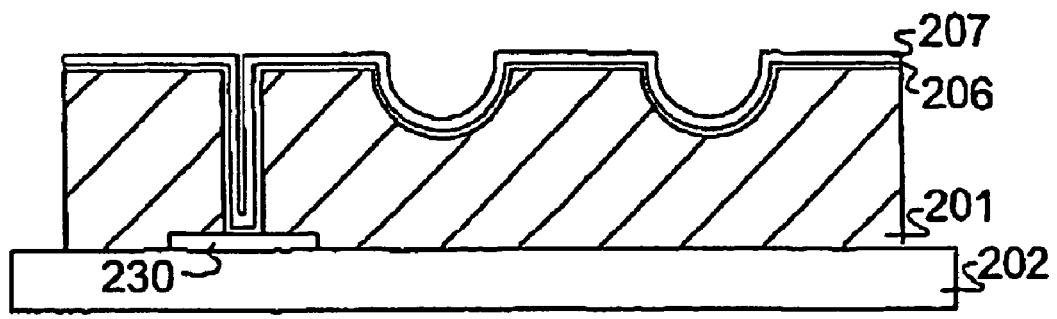
Figure 2C:
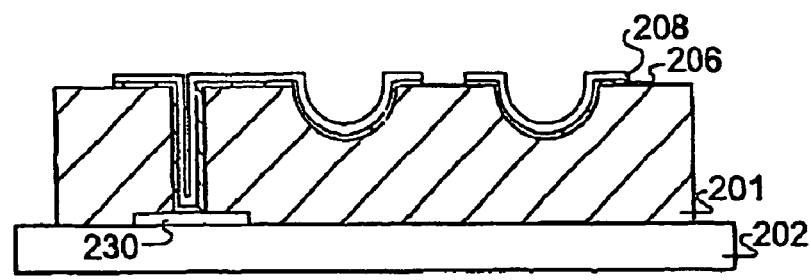

Referring now to FIGS. 2a-2c, a first embodiment of an inventive manufacturing method will be described. Initially a mould structure or insert 203 is created from the master structure. The mould insert 203 is obtained by electroforming the master, which entails depositing a metal seed-layer onto the master structure, electroplating a thick layer of metal, separating the mould insert 203 from the master and planarising the backside of the mould insert.

The master structure is then replicated by one of three methods. Replication by casting is initiated by forming a cavity between the mould insert 203 and a substrate 202 which is filled with a suitable polymer material 201, thus replicating the master structure.

Alternatively, the master structure may be replicated by injection moulding or embossing in a suitable polymer. The substrate 202 is then joined at a later stage of the manufacturing process.

The mould insert 203 holds the three-dimensional geometry of the final component, i.e. a toroidal coil in the example discussed here, and comprises a semi-torus 204 and a via core structure 205. The substrate 202 on which the polymer layer is provided is preferably part of an electric circuit (not shown)

with which the toroidal coil is to be connected by means of a via obtained by the via core structure 205 and a contact pad 230.

After replication by the chosen method, the polymer layer 201 is metallised with a thin conductive layer 206. The thin conductive layer 206 is used as an electrode in a process for application of photoresist by electrodeposition. Electrodeposition provides a conformal coating of photoresist 207 over the three-dimensional geometry of the polymer layer 201. The photoresist 207 is then patterned by methods known to those skilled in the art.

The patterning will entail providing a side-wall pattern for the conductive parts of the component and, as illustrated in FIG. 1, provide the coil with the conductive path 101 as well as the connecting ends 102,103.

Preferably, the conductive path is provided by electroplating or electroless plating a suitable metal onto the patterned polymer layer 201 prior to joining of the first and second layers. However, the conductive path may be provided by internal plating after joining of the polymer layers. A suitable metal will be selected by the skilled person when using the inventive method.

After provision of the conductive path, the photoresist is removed and the seed layer etched away by methods known in the art to provide separate conductive paths 208.

Figure 2D:
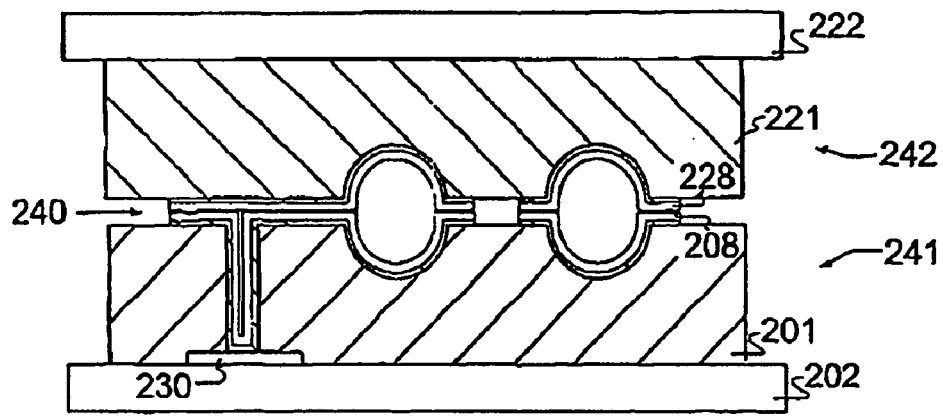

Referring now to FIG. 2d, in which is shown a first and a second structure halve 241,242 comprising substrates 202, 222 polymer layers 201,221 and conductive paths having been subject to the processing steps discussed above in connection with FIGS. 2a-2c. The second structure 242 is aligned with respect to the first structure 241 using visual and mechanical systems that are outside the scope of the present invention. FIG. 2d also illustrates a finalised component 240 comprising the two joined structure halves 241,242 created by the method as disclosed above.

Normally, plating of the conductive paths 208,228 is performed prior to the joining of the two halves 241,241 and a conducting joint may be achieved by thermocompression bonding or by a short period of electroless or electrolytic internal plating.

Figure 3:
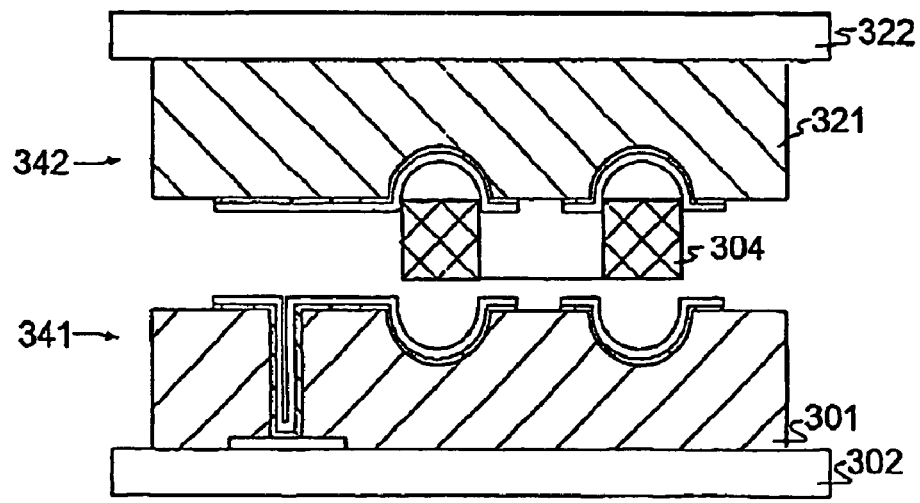
FIG. 3 shows schematically a cross sectional view of a substrate comprising a ferromagnetic core.

FIG. 3 illustrates schematically a step of toroidal coil manufacturing prior to joining of two halves 341,342 similar to the halves 241,242 in FIG. 2d. On top of substrates 302,322 are respective polymer support structures 301,321 and provided with a ferromagnetic core 304.

In low frequency applications, attempts have been made to solve the problem of creating integrated inductors by micromachining of components. The requirement of low frequency applications is that the inductance value of the coil should be in the range of micro Henrys. In order to create such high inductance values the core of the coil should be filled by some ferromagnetic material. FIG. 3 shows that a toroidal coil manufactured according to the invention can be provided with a ferromagnetic core 304 during the process of joining the two halves 341,341.

An alternative way of obtaining a ferromagnetic core of the coil is to fill the interior of the finished coil with ferromagnetic particles via fluid channels provided for internal plating of the conductive layer, as discussed above. This can be done with the help of a carrier liquid that solidifies at, e.g., room temperature.

Figure 4A:
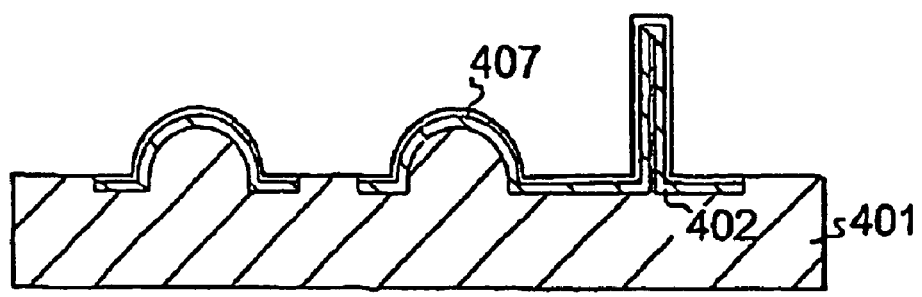
FIG. 4a-4c shows schematically cross sectional views of substrates during different stages of a second embodiment of a manufacturing method according to the present invention.

A second embodiment of the inventive method will now be described with reference to FIGS. 4a-4c. As in the, more or less, direct method of replication discussed in connection with FIGS. 2a-2d, a master structure is needed in this second embodiment. However, in contrast to the previously described embodiment, here the master structure is initially replicated into one or more template structures 401. Such a template structure 401 acts as a platform for a conductive layer 407. The template structure 401 is metallised with a seed-layer 402 and patterned as described in conjunction with the first embodiment. The side-wall pattern is subsequently electroplated or electroless plated to provide the conductive layer 407.

Figure 4B:
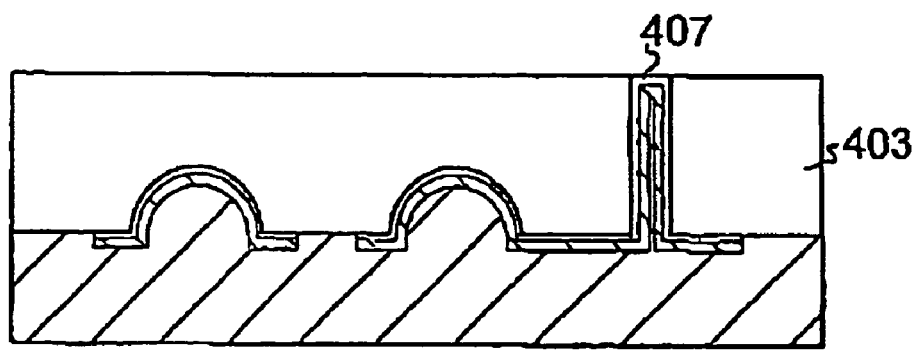

A polymer support structure 403 is then deposited onto the plated conductive layer 407, as illustrated in FIG. 4b. This deposition of polymer 403 may be obtained by way of any of the processes as discussed in connection with FIGS. 2a and 2b. The deposition of the polymer layer 403 results in a joining of the plated conductive layer 407 and the polymer support structure 403.

Figure 4C:
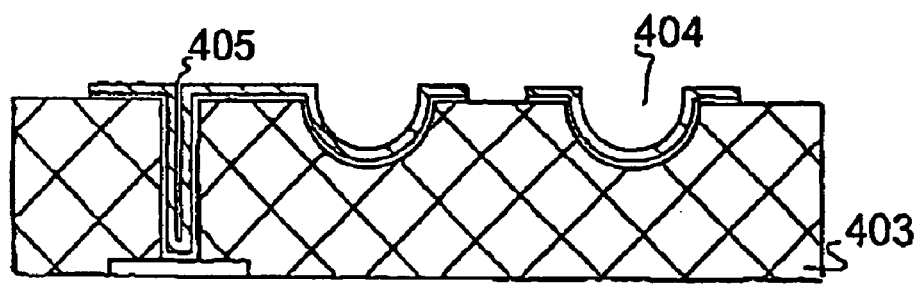

The template structure 401 and the polymer support structure 403 are then separated resulting, as is illustrated in FIG. 4c, in a substrate comprising the conductive path of a toroidal coil 404 and a via core structure 405 supported by the polymer support structure 403. Further manufacture of a complete toroidal coil is then performed according to the steps described in the first embodiment. Needless to say, one and the same template may be used to manufacture a plurality of polymer structures.

Figure 5A:
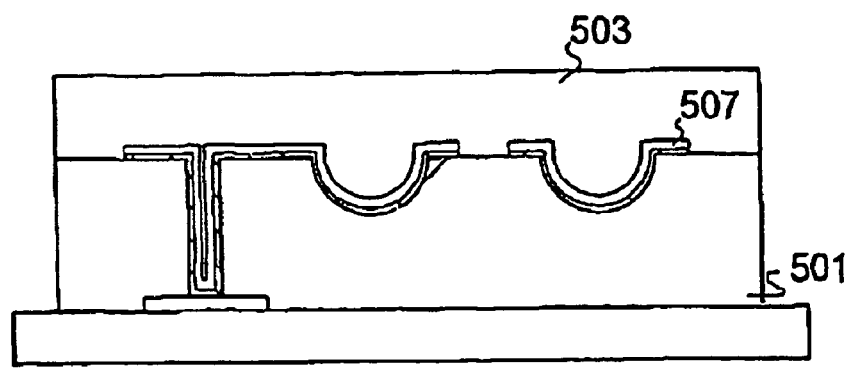
FIG. 5a-5c shows schematically cross sectional views of substrates during different stages of a third embodiment of a manufacturing method according to the present invention.
Figure 5B:
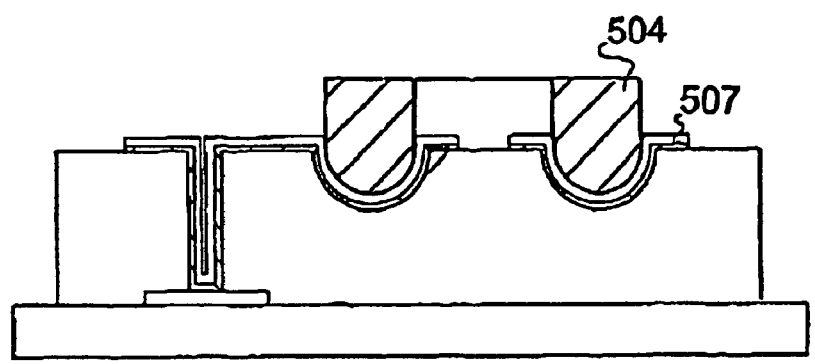
Figure 5C:
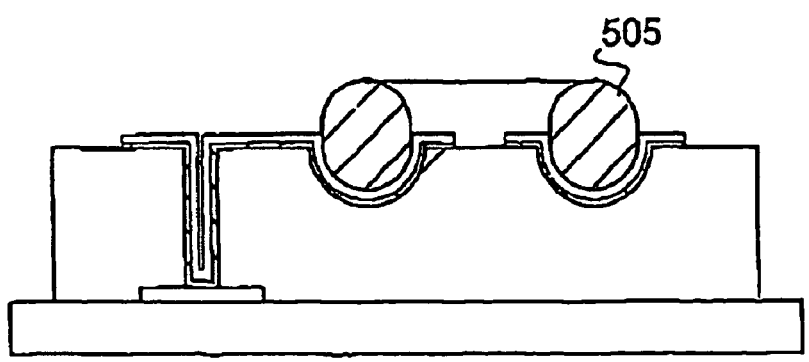

A third embodiment of the inventive method will now be described with reference to FIGS. 5a-5c. A polymer support structure 501 comprising a conductive path 507 is obtained by way of any of the manufacturing methods according to the first or second embodiment discussed above.

A layer of photoresist 503 is deposited onto the polymer support structure 501 and the conductive layer 507 by way of any known technique such as spin coating, spray coating, electrodeposition or possibly casting. All areas except a torus shaped area 504 on top of the conductive layer 507 of the coil is removed by way of exposure and development according to known art, as illustrated in FIG. 5b. The remaining photo resist is heated leading to a flowing and reshaping of the resist into a more or less rounded torus of photo resist 505, as illustrated in FIG. 5c.

A seed-layer is then provided onto the sacrificial layer and patterned as described above in connection with the first and second embodiments. Electroplating or electroless plating then provides the conductive path to complete the component.

The embodiments of manufacturing methods described above may be used to manufacture a number of different miniaturised electric components and circuitry comprising a plurality of such components.

Stand-alone components and systems as exemplified in FIG. 1 include inductors, arrays of inductors, transformers and arrays of transformers, differing in the way in which the conductive paths, and connections to the paths, are arranged. In FIGS. 6a-6d is shown an electric stand-alone component 600 placed on a multichip module carrier substrate 601 and encapsulated in a polymer support structure 602 In FIG. 6a, the stand-alone component is, together with other RF circuitry 604, further embedded in a protective polymer encapsulation 603.

Figure 6A:
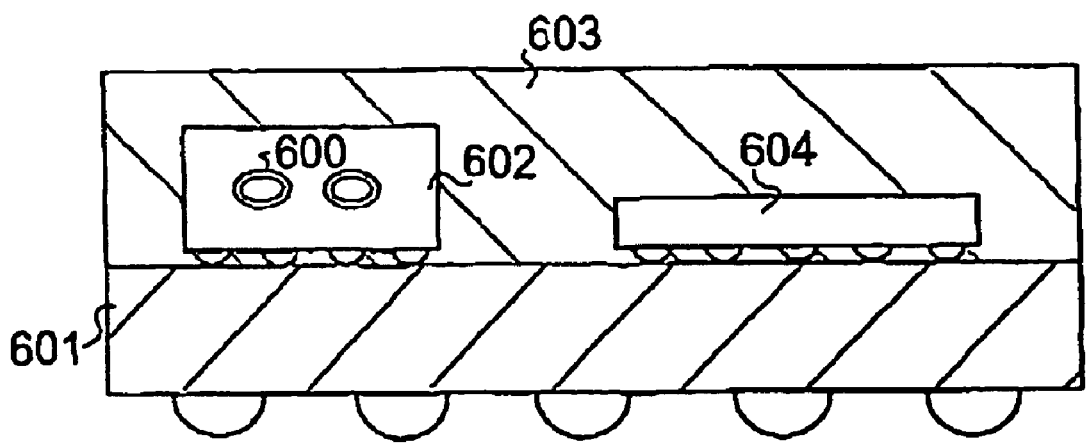
FIGS. 6a-d shows schematically cross sectional views of circuits comprising an inductor according to the present invention.
Figure 6B:
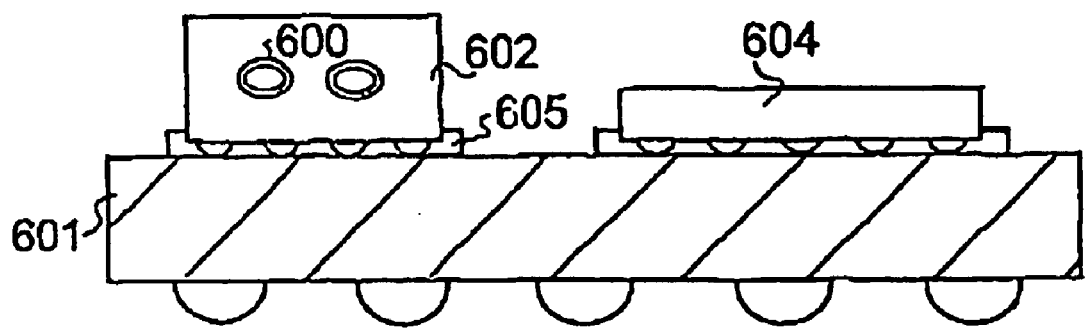

In FIG. 6b, the stand-alone component 600 is underfilled with a protective polymer layer 605 instead of being encapsulated.

Figure 6C:
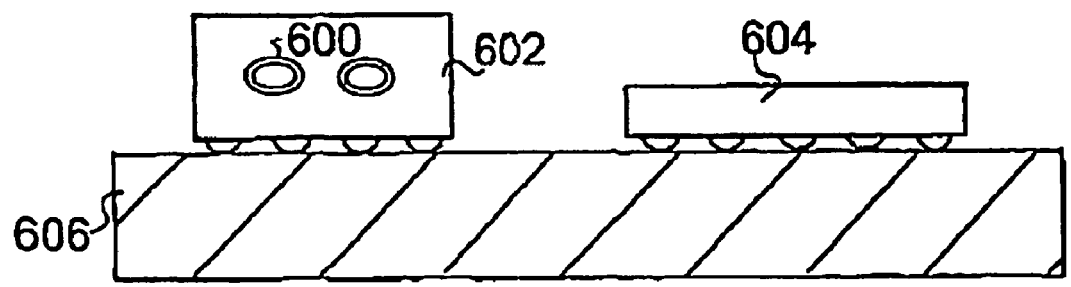

In FIG. 6c, the component is a stand-alone component placed, together with other RF circuitry 604, on a printed wiring board 606 and encapsulated in a polymer support structure 602.

Figure 6D:
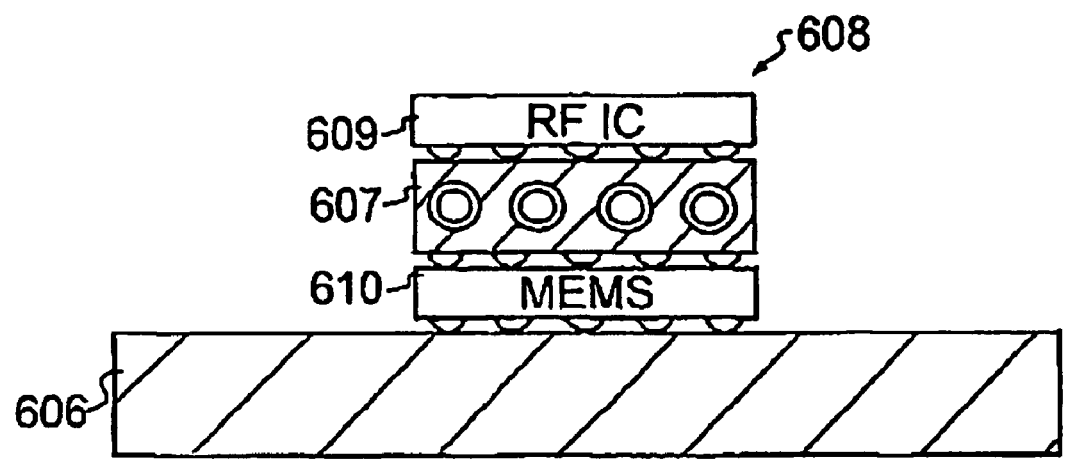

In FIG. 6d, the inventive component 607 is part of a 3-dimensional stacked multichip module 608 on a printed circuit board 604, including other stacked RF circuitry 609 and 610, including various RF, MEMS, processor and memory devices.

Figure 7:
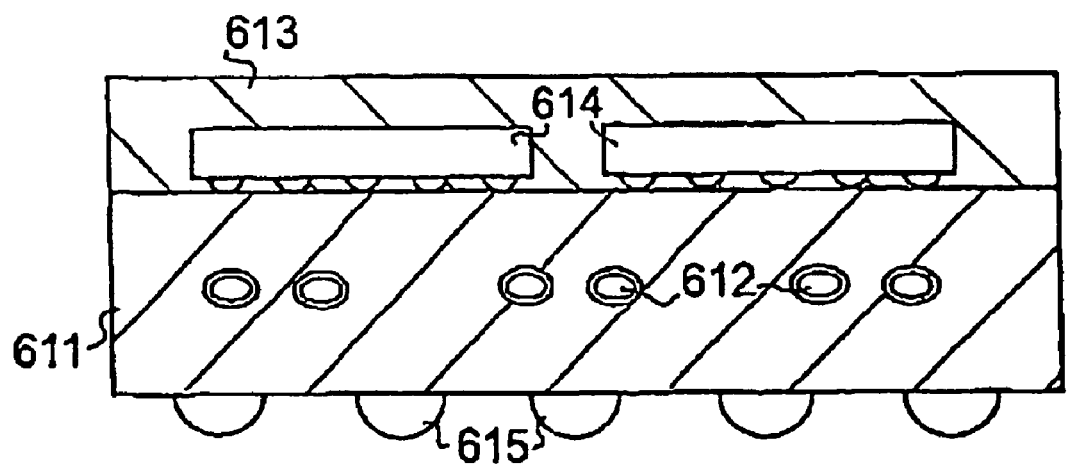
FIG. 7 shows schematically a cross sectional view of a circuit comprising an inductor according to the present invention.

In FIG. 7, the components 612 according to the invention are embedded in a multichip 614 module carrier substrate 611. The multichip modules 614 may be encapsulated 613 and the carrier substrate 611 provided with flip-chip solder bumps 615. Of course any appropriate bonding technique can be used.

Figure 8:
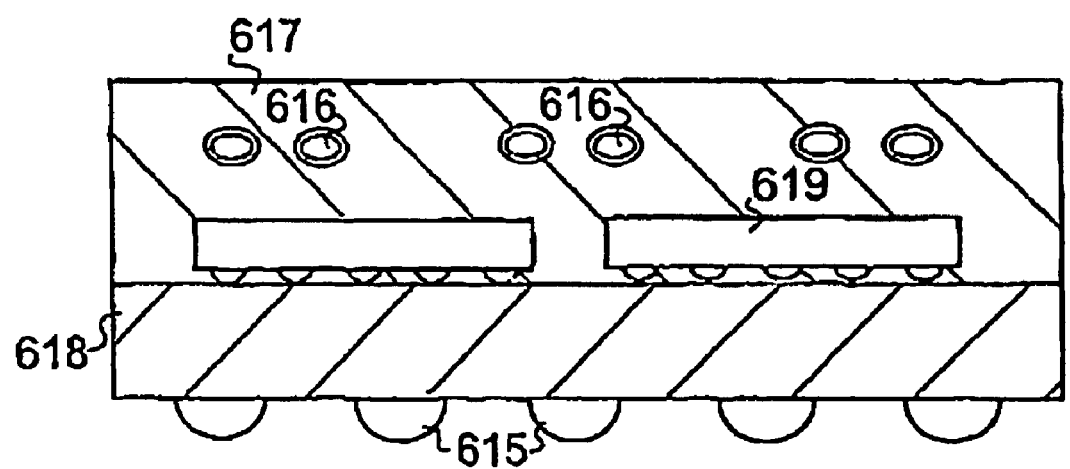
FIG. 8 shows schematically a cross sectional view of a circuit comprising an inductor according to the present invention.

In FIG. 8, the components 616 according to the invention are is embedded in a protective polymer encapsulation 617 above a multichip module 619 carrier substrate 618.

Naturally, the components may also be manufactured such that a carrier polymer substrate contains, apart from the embedded inductor coils, also the vias and interconnecting wires.

Figure 9:
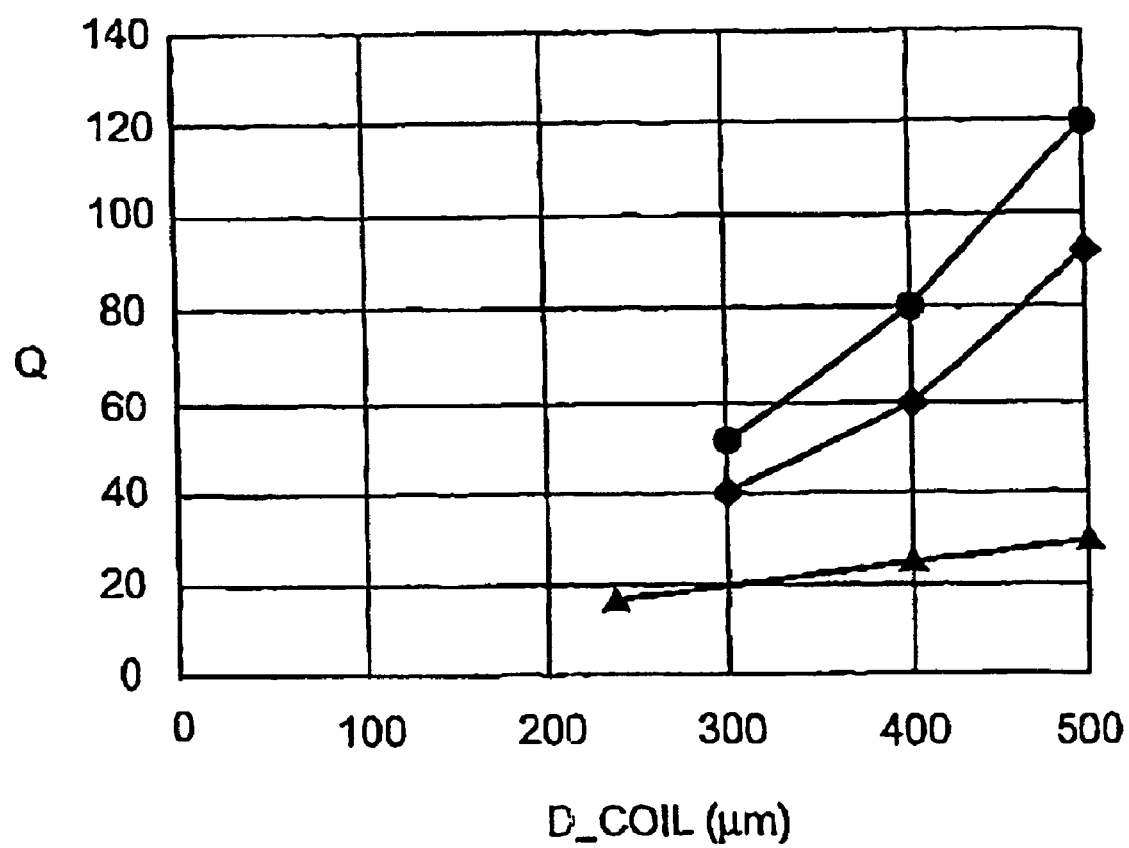
FIG. 9 shows a diagram of Q-values for inductors.

Although the components that may be manufactured in accordance with the invention include capacitors, resistors and simple electrodes, it is foreseen that miniature inductive components will be a major area of application, not least due to the fact that prior art miniaturised inductors have lower Q-values. In comparison with prior-art devices such as the devices of U.S. Pat. No. 5,793,272, the cross-section of the torus that determines the Q value can be made much larger. Using the expression for the Q-value for a toroidal inductor:

$$Q_m = \sqrt{\frac{\mu_0}{\pi \rho_{Cu}}} \cdot \frac{\sqrt{f \cdot r_{torus} \cdot (4\pi R_{coil} - 2 \cdot N \cdot S_{coil})}}{2 R_{coil}}$$

and inserting values for the parameters for Copper and Gold, the diagram of FIG. 9 is obtained. In the diagram of FIG. 9, the Q-value is plotted as a function of outer diameter of the toroidal coil with electroplated copper conductors (circles) or electroplated gold conductors (squares). For comparison, data for a state-of-the-art optimised planar coil on insulating substrate with 8 μm gold conductors are included (triangles).

From the diagram of FIG. 9 it can be seen that, for a similar coil diameter, the Q-value is more than twice as large for a toroidal inductor manufactured in accordance with the invention, as compared with a state-of-the-art inductor.

Additional advantages of a toroidal inductor become apparent when considering the interference of the radio frequency signals of the coil with other electronics in it's vicinity. The interference is minimal because the field is concentrated inside the torus with very small leakage and with very small guard. Thus the toroidal coil can be placed on top of active circuitry. Moreover, no area on top of the circuitry is lost hence allowing for a more compact mechanical design.

The invention claimed is:

1. A miniaturized three-dimensional electric component comprising a first polymer support structure and a second polymer support structure, each micro replicated from a master structure, on which first polymer support structure at least one conductive path is provided and on which second polymer support structure at least one conductive path is provided, said first and second polymer support structures joined to obtain said electric component, wherein said at least one conductive path of said first and second polymer support structures are electrically connected therebetween.

2. An electric component according to claim 1, wherein the component is a stand-alone component placed on a printed wiring board and encapsulated in a polymer support structure.

3. An electric component according to claim 1, where the component is any one of:
   inductor,
   transformer,
   inductor with ferromagnetic core,
   sensor for a flux gate magnetometer,
   capacitor,
   resistor,
   sensor electrode for electrochemical measurements.

4. A mobile telephone terminal comprising the electric component according to claim 1.

5. An electric component according to claim 1, wherein the stand-alone component is joined by thermocompression bonding.

6. An electric component according to claim 1, wherein the stand-alone component is joined by electroless plating.

7. An electric component according to claim 1, wherein the conductive path of the stand-alone component includes a coil with connecting ends.

8. An electric component according to claim 7, further comprising a via.

9. An electric component according to claim 1, wherein the at least one conductive path of said first and second polymer support structures connected together includes a coil with connecting ends.

10. An electric component according to claim 1, wherein said first polymer support structure comprises a semi-torus and a via core structure and said second polymer support structure comprises a semi-torus corresponding to the semi-torus of the first polymer support structure, wherein the conductive path is provided on the semi-torus of the first and second polymer support structure so as to form a toroidal coil and wherein a conductive path in said via core structure forms a via for electrical connection to contact pad.

11. An electric component according to claim 10, further comprising a ferromagnetic core within the toroidal coil.

12. An electric component according to claim 11, wherein said ferromagnetic core is positioned between each semi-torus prior to joining the first and second polymer support structures.

13. An electric component according to claim 11, wherein the interior of the toroidal coil is filled with ferromagnetic particles via a fluid channel.

* * * * *